(12) United States Patent
Lee et al.

(10) Patent No.: US 9,130,117 B2
(45) Date of Patent: Sep. 8, 2015

(54) LIGHT EMITTING DEVICE

(75) Inventors: Yonggyeong Lee, Seoul (KR); Woosik Lim, Seoul (KR); Jaewon Seo, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 13/449,447

(22) Filed: Apr. 18, 2012

(65) Prior Publication Data
US 2013/0051074 A1   Feb. 28, 2013

(30) Foreign Application Priority Data

Aug. 30, 2011 (KR) .................. 10-2011-0087326

(51) Int. Cl.
*H01L 33/00* (2010.01)
*H01L 33/60* (2010.01)
*H01L 33/24* (2010.01)
*H01L 33/46* (2010.01)
*H01L 33/52* (2010.01)
*H01L 33/38* (2010.01)

(52) U.S. Cl.
CPC .............. *H01L 33/24* (2013.01); *H01L 33/46* (2013.01); *H01L 33/38* (2013.01); *H01L 33/385* (2013.01); *H01L 2924/0002* (2013.01)

(58) Field of Classification Search
CPC ......... H01L 33/00; H01L 33/60; H01L 33/38; H01L 33/46; H01L 51/5271; H01L 27/15
USPC .............. 257/21, 79–82, 98, 99, 184
See application file for complete search history.

(56) References Cited

U.S. PATENT DOCUMENTS

| 5,952,681 | A | 9/1999 | Chen ............................... 257/89 |
| 5,977,565 | A | 11/1999 | Ishikawa et al. ................ 257/81 |
| 7,005,684 | B2* | 2/2006 | Uemura et al. ................. 257/99 |
| 7,109,529 | B2* | 9/2006 | Uemura et al. ................. 257/99 |
| 2003/0062530 | A1* | 4/2003 | Okazaki et al. ................ 257/79 |
| 2004/0065892 | A1* | 4/2004 | Uemura et al. ................. 257/99 |

(Continued)

FOREIGN PATENT DOCUMENTS

| EP | 1 848 043 A1 | 10/2007 |
| EP | 2 296 199 A2 | 3/2011 |

OTHER PUBLICATIONS

Gaw et al., Polyimide-Epoxy Composites, 1999, Springer-Verlag, Advances in Polymer Science, vol. 140, pp. 108-112.*

(Continued)

*Primary Examiner* — Julia Slutsker
*Assistant Examiner* — Natalia Gondarenko
(74) *Attorney, Agent, or Firm* — KED & Associates, LLP

(57) ABSTRACT

A light emitting device is disclosed. The light emitting device includes a light emitting structure including a first semiconductor layer doped with a first dopant while including a first region and a second region stepped relative to the first region, a second semiconductor layer doped with a second dopant different from the first dopant while disposed over the second region, and an active layer disposed between the first and second semiconductor layers, a first electrode disposed on the first region, and a functional member disposed between one side surface of the light emitting structure adjacent to the first electrode and the first electrode while being disposed at the first region, wherein the functional member has a thickness greater than a thickness of the first electrode and less than a thickness of the light emitting structure, with respect to a surface of the first region.

18 Claims, 13 Drawing Sheets

(56) References Cited

U.S. PATENT DOCUMENTS

| | | | |
|---|---|---|---|
| 2005/0211989 A1* | 9/2005 | Horio et al. | 257/79 |
| 2006/0192223 A1* | 8/2006 | Lee et al. | 257/99 |
| 2008/0185606 A1* | 8/2008 | Sano et al. | 257/98 |
| 2009/0283787 A1 | 11/2009 | Donofrio et al. | 257/98 |
| 2010/0117070 A1* | 5/2010 | Adekore et al. | 257/43 |
| 2010/0213488 A1* | 8/2010 | Choi et al. | 257/98 |
| 2010/0230706 A1* | 9/2010 | Tsai et al. | 257/98 |

OTHER PUBLICATIONS

European Search Report dated Oct. 17, 2014, issued in Application No. 12165370.3 (English translation).

* cited by examiner

LIGHT EMITTING DEVICE

CROSS-REFERENCE TO RELATED APPLICATION

This application claims the priority benefit of Korean Patent Application No. 10-2011-0087326, filed on Aug. 30, 2011 in the Korean Intellectual Property Office, the disclosure of which is incorporated herein by reference.

BACKGROUND

1. Field

Embodiments relate to a light emitting device.

2. Description of the Related Art

Light Emitting Diodes (LEDs) are representative of light emitting devices, and refer to devices which convert electrical signals into light such as infrared light or visible light using characteristics of compound semiconductors. Such LEDs are being utilized in home appliances, remote controllers, electronic displays, displays, and various other automated machines, and the application range thereof is gradually increasing.

In general, miniature LEDs are fabricated into surface mount devices so as to be directly mounted on a Printed Circuit Board (PCB), and hence, LED lamps, which serve as display devices, are being developed into surface mount devices. The surface mount devices can substitute for conventional simple lamps and are used in a variety of color on-and-off displays and character displays and image displays.

Recently, studies into enhancing luminous efficiency of the light emitting devices are underway.

SUMMARY

Embodiments provide a light emitting device.

In one embodiment, a light emitting device includes a light emitting structure including a first semiconductor layer doped with a first dopant while including a first region and a second region stepped relative to the first region, a second semiconductor layer doped with a second dopant different from the first dopant while disposed over the second region, and an active layer disposed between the first and second semiconductor layers, a first electrode disposed on the first region of the first semiconductor layer, a second electrode disposed over the second semiconductor layer, a light transmitting electrode layer disposed between the second semiconductor layer and the second electrode, and a functional member disposed between one side surface of the light emitting structure and the first electrode, wherein the functional member has a height greater than a thickness of the first electrode and less than a thickness of the light emitting structure, with respect to a thickness direction of the light emitting structure.

BRIEF DESCRIPTION OF THE DRAWINGS

Details of embodiments will be more clearly understood from the following detailed description taken in conjunction with the accompanying drawings, in which.

DETAILED DESCRIPTION OF EMBODIMENTS

Figure 1:
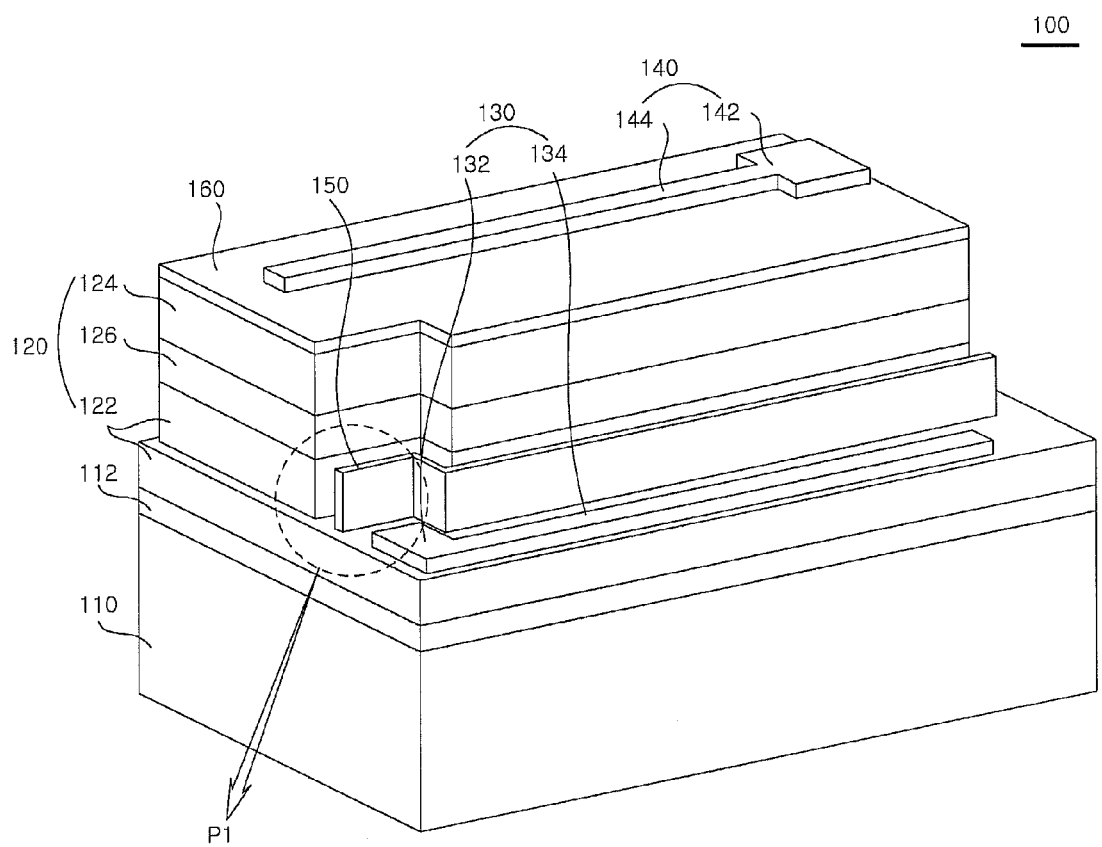
FIG. 1 is a perspective view illustrating a light emitting device according to a first embodiment.

Reference will now be made in detail to embodiments, examples of which are illustrated in the accompanying drawings. However, the present disclosure may be embodied in many different forms and should not be construed as limited to the embodiments set forth herein. Rather, these embodiments are provided so that this disclosure will be thorough and complete, and will fully convey the scope of the disclosure to those skilled in the art. The present disclosure is defined only by the categories of the claims. In certain embodiments, detailed descriptions of device constructions or processes well known in the art may be omitted to avoid obscuring appreciation of the disclosure by a person of ordinary skill in the art. Wherever possible, the same reference numbers will be used throughout the drawings to refer to the same or like parts.

Spatially-relative terms such as "below", "beneath", "lower", "above", or "upper" may be used herein to describe one element's relationship to another element as illustrated in the Figures. It will be understood that spatially-relative terms are intended to encompass different orientations of the device in addition to the orientation depicted in the Figures. For example, if the device in one of the figures is turned over, elements described as "below" or "beneath" other elements would then be oriented "above" the other elements. The exemplary terms "below" or "beneath" can, therefore, encompass both an orientation of above and below. Since the device may be oriented in another direction, the spatially-relative terms may be interpreted in accordance with the orientation of the device.

The terminology used in the present disclosure is for the purpose of describing particular embodiments only and is not intended to limit the disclosure. As used in the disclosure and the appended claims, the singular forms "a", "an" and "the" are intended to include the plural forms as well, unless context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

In the drawings, the thickness or size of each layer is exaggerated, omitted, or schematically illustrated for convenience of description and clarity. Also, the size or area of each constituent element does not entirely reflect the actual size thereof.

Angles or directions used to describe the structures of light emitting devices according to embodiments are based on those shown in the drawings. Unless there is, in the specification, no definition of a reference point to describe angular positional relations in the structures of the light emitting devices, the associated drawings may be referred to.

Figure 2:
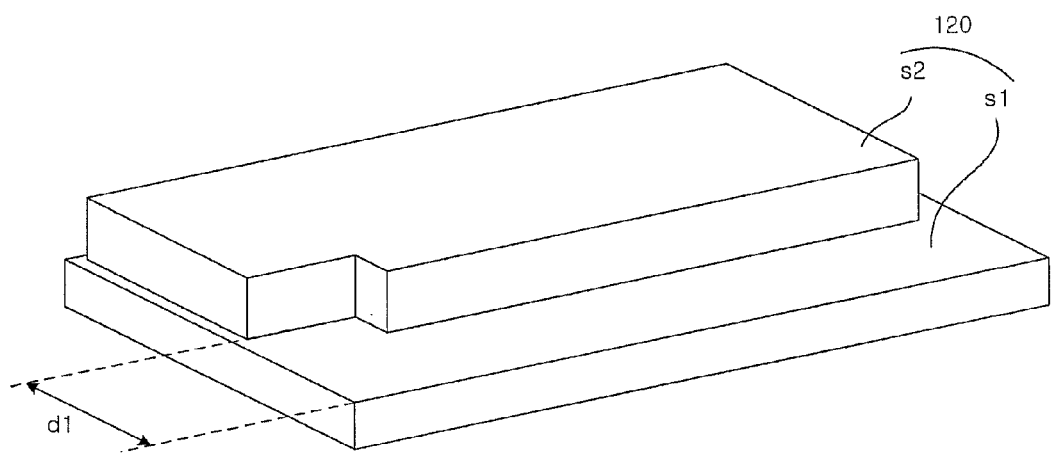
FIG. 2 is a perspective view illustrating a first semiconductor layer shown in FIG. 1.

FIG. 1 is a perspective view illustrating a light emitting device according to a first embodiment. FIG. 2 is a perspective view illustrating a first semiconductor layer shown in FIG. 1.

Referring to FIGS. 1 and 2, the light emitting device, which is designated by reference numeral 100, may include a support substrate 110 and a light emitting structure 120 disposed over the support substrate 110.

The support substrate 110 has light transmitting properties and is a substrate upon which a semiconductor layer may be easily grown. The support substrate 110 may be a substrate made of a material different from the semiconductor layer or a substrate made of the same material as the semiconductor layer. The support substrate 110, for example, may be a substrate made of sapphire ($Al_2O_3$). Alternatively, the support substrate 110 may be a substrate made of silicon carbide (SiC) having higher thermal conductivity than the sapphire ($Al_2O_3$) substrate, but the present disclosure is not limited thereto.

That is, the support substrate 110 may be made of, for example, zinc oxide (ZnO), gallium nitride (GaN), aluminum nitride (AlN), or the like. Also, the support substrate 110 may be made of any one selected from gold (Au), nickel (Ni), tungsten (W), molybdenum (Mo), copper (Cu), aluminum (Al), tantalum (Ta), silver (Ag), platinum (Pt), and chromium (Cr), or be made of an alloy containing two or more materials. Furthermore, the support substrate 110 may be formed by laminating two or more layers of different materials.

Although the support substrate 110 may have a lower index of refraction than the light emitting structure 120 in order to enhance light extraction efficiency, the present disclosure is not limited thereto.

Also, impurities on a surface of the support substrate 110 may be removed through wet washing. The support substrate 110 may be provided, at the surface thereof, with a patterned sapphire substrate (PSS) structure at which a light extraction pattern is formed, in order to enhance light extraction efficiency, but the present disclosure is not limited thereto.

Furthermore, the support substrate 110 may be made of a material capable of achieving an enhancement in thermal stability to easily dissipate heat.

Meanwhile, an anti-reflective layer (not shown) may be disposed on the support substrate 110, to enhance light extraction efficiency. The anti-reflective layer is referred to as an anti-reflective (AR) coating layer. The anti-reflective layer basically utilizes interference among light reflected from a plurality of interfaces. That is, the anti-reflective layer functions to shift phases of light reflected from different interfaces such that the phases have a difference of 180 degrees, namely, to offset the light, thereby reducing intensities of the reflected light, but the present disclosure is not limited thereto.

A buffer layer 112 may be disposed on the support substrate 110, to reduce lattice misalignment between the support substrate 110 and the light emitting structure 120 while enabling easy growth of a plurality of semiconductor layers.

In the illustrated embodiment, the light emitting device 100 may further include at least one layer or pattern formed using a Group II-VI compound semiconductor, for example, a ZnO layer (not shown) or an undoped semiconductor layer (not shown) which is disposed on the support substrate 110, in addition to the buffer layer 112. Although the buffer layer 112 will be described as being disposed on the support substrate 110 in the illustrated embodiment, the present disclosure is not limited thereto.

The buffer layer 112 may be grown on the support substrate 110 in the form of a single crystal. The buffer layer 112 grown to have the single crystal may enable an enhancement in crystallinity of the light emitting structure 120 which is grown over the buffer layer 112.

Also, the buffer layer 112 may be formed in a low temperature mode. For example, the buffer layer 112 may contain at least one of GaN, InN, AlN, AlInN, InGaN, AlGaN, and InAlGaN, but the present disclosure is not limited thereto.

That is, the buffer layer 112 may be formed to have an AlInN/GaN laminate structure, an InGaN/GaN laminate structure, an AlInGaN/InGaN/GaN laminate structure, or the like.

The light emitting structure 120 may include a first semiconductor layer 122 disposed over the support substrate 110 or the buffer layer 112, an active layer 126 disposed on the first semiconductor layer 122, and a second semiconductor layer 124 disposed on the active layer 126.

First, when the first semiconductor layer 122 is implemented as an n-type semiconductor layer, the first semiconductor layer 122 may be made of, for example, a semiconductor material having a formula of $In_xAl_yGa_{1-x-y}N$ ($0 \leq x \leq 1$, $0 \leq y \leq 1$, and $0 \leq x+y \leq 1$). For example, the first semiconductor layer 122 may be made of a semiconductor material selected from GaN, AlN, AlGaN, InGaN, InN, InAlGaN, AlInN, and the like, and may be doped with an n-type dopant such as Si, Ge, Sn, Se, Te, or the like.

In this case, the above-mentioned undoped semiconductor layer, which is not doped with a dopant, may be disposed between the first semiconductor layer 122 and the buffer layer 112. The undoped semiconductor layer refers to a layer formed to enhance crystallinity of the first semiconductor layer 122, and is not doped with the n-type dopant. Accordingly, the undoped semiconductor layer may be equal to the first semiconductor layer 122, except for having lower electrical conductivity than the first semiconductor layer 122, but the present disclosure is not limited thereto.

Referring to FIG. 2, the first semiconductor layer 122 may include a first region s1 and a second region s2 stepped relative to the first region s1.

In this case, the active layer 126 and the second semiconductor layer 124 may be disposed over the second region s2, and the first region s1 may be a region etched using a predetermined etching method and exposed to the outside so as to dispose a first electrode 130 which will be described later.

The first region s1 may have a width d1 of 5 μm to 15 μm as shown in FIG. 2. When the width d1 of the first region s1 is less than 5 μm, it may be difficult to dispose a first electrode 130 and a functional member 150 which will be described later. On the other hand, when the width d1 of the first region s1 is greater than 15 μm, the first electrode 130 and the functional member 150 may be easily disposed, although forward voltage (VF) of the light emitting device 100 is increased and a width of the active layer 126 is decreased. As a result, luminous efficiency may be deteriorated.

The active layer 126 may be disposed on the second region s2 of the first semiconductor layer 122. The active layer 126 may be formed to have a single quantum well structure, a multi quantum well (MQW) structure, a quantum wire structure, a quantum dot structure, or the like, using a Group III-V compound semiconductor material.

When the active layer 126 has the quantum well structure, the active layer 126, for example, may have the single or multi quantum well structure, which includes a well layer having a formula of $In_xAl_yGa_{1-x-y}N$ ($0 \leq x \leq 1$, $0 \leq y \leq 1$, and $0 \leq x+y \leq 1$) and a barrier layer having a formula of $In_aAl_bGa_{1-a-b}N$ ($0 \leq a \leq 1$, $0 \leq b \leq 1$, and $0 \leq a+b \leq 1$). The well layer may be made of a material having a smaller band gap than the barrier layer.

In the active layer 126, the well layer or barrier layer adjacent to the second semiconductor layer 124 may have a greater energy band gap than the well layer or barrier layer adjacent to the first semiconductor layer 122.

A conductive clad layer (not shown) may be disposed over and/or beneath the active layer 126. The conductive clad layer may be made of an AlGaN-based semiconductor and have a greater band gap than the active layer 126.

The second semiconductor layer 124 may be disposed on the active layer 126 and be implemented as a p-type semiconductor layer. When the second semiconductor layer 124 is implemented as the p-type semiconductor layer, the second semiconductor layer 124 may be made of, for example, a semiconductor material having a formula of $In_xAl_yGa_{1-x-y}N$ ($0 \leq x \leq 1$, $0 \leq y \leq 1$, and $0 \leq x+y \leq 1$). For example, the second semiconductor layer 124 may be made of a semiconductor material selected from GaN, AlN, AlGaN, InGaN, InN, InAlGaN, AlInN, and the like, and may be doped with a p-type dopant such as Mg, Zn, Ca, Sr, Ba, or the like.

The above-mentioned first semiconductor layer 122, active layer 126, and second semiconductor layer 124 may be formed, for example, using metal organic chemical vapor deposition (MOCVD), chemical vapor deposition (CVD), plasma-enhanced chemical vapor deposition (PECVD), molecular beam epitaxy (MBE), hydride vapor phase epitaxy (HYPE), or the like, but the present disclosure is not limited thereto.

Also, the n-type and p-type dopants doped in the respective first and second semiconductor layers 122 and 124 may have a uniform or non-uniform doping concentration. That is, a plurality of semiconductor layers may be formed to have various structures, but the present disclosure is not limited thereto.

Unlike this, the first semiconductor layer 122 may be implemented as a p-type semiconductor layer, whereas the second semiconductor layer 124 may be implemented as an n-type semiconductor layer. Thus, the light emitting structure 120 may have at least one of an N—P junction structure, a P—N junction structure, an N—P—N junction structure, and a P—N—P junction structure.

That is, although the first and second semiconductor layers 122 and 124, which interpose the active layer 126 therebetween, may also be reversely located in the light emitting structure 120, the first semiconductor layer 122 will be described as being implemented as the n-type semiconductor layer and being disposed adjacent to the support substrate 110 below.

The first electrode 130 may be disposed on the first region s1 of the first semiconductor layer 122 so as to be electrically connected to the first semiconductor layer 122. The first electrode 130 may be formed on the first semiconductor layer 122 and include a first pad electrode 132 and a first finger electrode 134.

Also, the first electrode 130 may be formed on the first region s1 exposed from the first semiconductor layer 122.

The first electrode 130 may come into ohmic contact with the semiconductor layer so as to smoothly supply power to the light emitting structure 120. The first electrode 130 may be formed selectively using a light transmitting conductive material and a metal material.

The first electrode 130 may contain a conductive material. For example, the first electrode 130 may contain at least one of nickel (Ni), platinum (Pt), ruthenium (Ru), iridium (Ir), rhodium (Rh), tantalum (Ta), molybdenum (Mo), titanium (Ti), silver (Ag), tungsten (W), copper (Cu), chromium (Cr), palladium (Pd), vanadium (V), cobalt (Co), niobium (Nb), zirconium (Zr), indium tin oxide (ITO), aluminum zinc oxide (AZO), indium zinc oxide (IZO), indium zinc tin oxide (IZTO), indium aluminum zinc oxide (IAZO), indium gallium zinc oxide (IGZO), indium gallium tin oxide (IGTO), antimony tin oxide (ATO), gallium zinc oxide (GZO), $IrO_x$, $RuO_x$, $RuO_x/ITO$, $Ni/IrO_x/Au$, and $Ni/IrO_x/Au/ITO$, or an alloy thereof, but the present disclosure is not limited thereto.

The first pad electrode 132 may be formed at one side on the first region s1 of the first semiconductor layer 122. There is no limit as to a position of the first pad electrode 132.

Also, there is no limit as to a shape of the first pad electrode 132. For example, the first pad electrode 132 may have various shapes such as circular, square, and semicircular shapes, taking into consideration convenience of a wire bonding operation or the like.

The second semiconductor layer 124 may be electrically connected with a second electrode 140, and the second electrode 140 may include a second pad electrode 142 and a second finger electrode 144.

The first and second finger electrodes 134 and 144 may have the same length or different lengths, but the present disclosure is not limited thereto. Although the first and second electrodes 130 and 140 are illustrated as including the first and second finger electrodes 134 and 144, respectively, the first and second finger electrodes 134 and 144 need not be included. However, the present disclosure is not limited to the above-mentioned configurations.

The second electrode 140 serves to supply the light emitting structure 120 with power, and may be made of the same material as the above-mentioned first electrode 130.

The second pad electrode 142 may be formed over the second semiconductor layer 124 while being formed at the other side of the first pad electrode 132.

In other words, there is no limit as to a position of the second pad electrode 142. For example, the second pad electrode 142 may be spaced apart from the first pad electrode 132 by a predetermined distance, taking into consideration current diffusion efficiency and luminous efficiency.

There is no limit as to a shape of the second pad electrode 142. For example, the second pad electrode 142 may have various shapes such as circular, square, and semicircular shapes, taking into consideration convenience of connection to a power source using a wire bonding method or the like.

The second finger electrode 144 may be connected to the second pad electrode 142 and extend in a direction of the first pad electrode 132.

Here, the first and second electrodes 130 and 140 may have a thickness of 0.4 μm to 3 μm, but the present disclosure is not limited thereto.

A light transmitting electrode layer 160 may be formed between the second electrode 140 and the second semiconductor layer 124.

The light transmitting electrode layer 160 is formed at a portion of or throughout an upper surface of the second semiconductor layer 124, thereby enabling prevention of a current crowding phenomenon and outward dissipation of light generated from the active layer 126.

That is, the light transmitting electrode layer 160, for example, may contain at least one of ITO, IZO (In—ZnO), GZO (Ga—ZnO), AZO (Al—ZnO), AGZO (Al—Ga ZnO), IGZO (In—Ga ZnO), $IrO_x$, $RuO_x$, $RuO_x/ITO$, $Ni/IrO_x/Au$, and $Ni/IrO_x/Au/ITO$, but the present disclosure is not limited thereto.

Here, the light transmitting electrode layer 160 may be formed, at an upper portion thereof, with a pattern (not shown), and the pattern may be any one of a dot pattern, an irregularity pattern, and lattice pattern.

That is, the pattern may serve to enhance light extraction efficiency, thereby preventing a current crowding phenomenon.

Meanwhile, a current blocking layer (CBL) (not shown) may be disposed between the light transmitting electrode layer 160 and the second electrode 140, between the light transmitting electrode layer 160 and the second semiconductor layer 124, or within the light transmitting electrode layer 160. The current blocking layer may be formed so that at least a portion of the current blocking layer is vertically overlapped with the second electrode 140.

In this case, a functional member 150 may be disposed on a portion of the first region s1 at which the first electrode 130 is not disposed.

The functional member 150 may be disposed in parallel with a stepped side surface between the first and second regions s1 and s2, and reflect or refract light emitted from the active layer 126, thereby preventing the light from being directed toward the first electrode 130.

The functional member 150 will be described with reference to FIGS. 3 to 5 in detail later.

Figure 3:
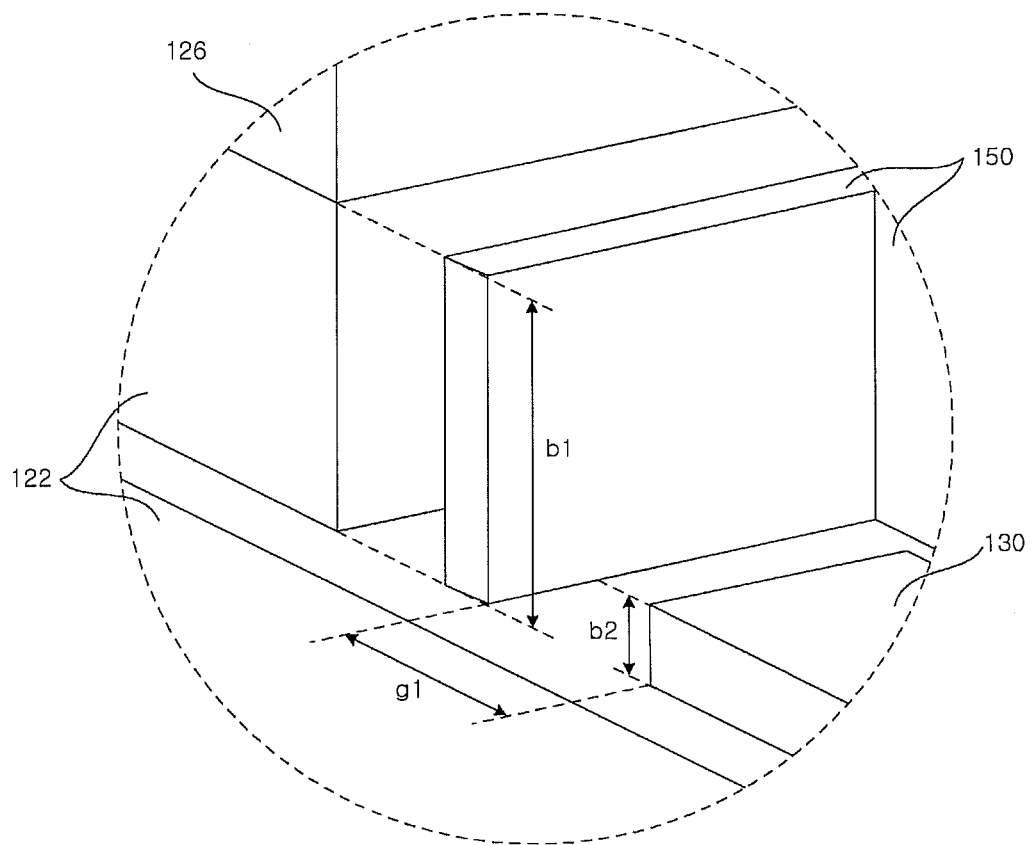
FIGS. 3 to 5 are enlarged views illustrating portion "P1" of FIG. 1 according to various exemplary embodiments.
Figure 4:
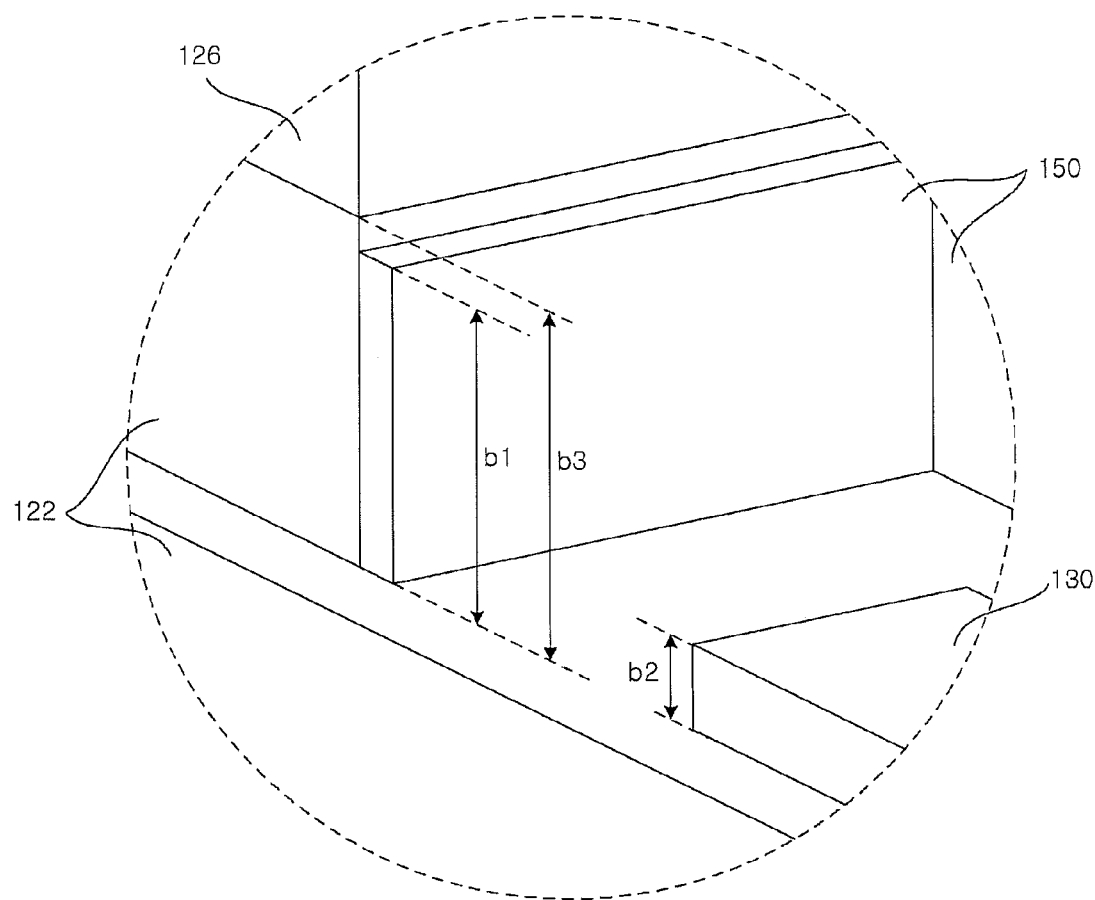
Figure 5:
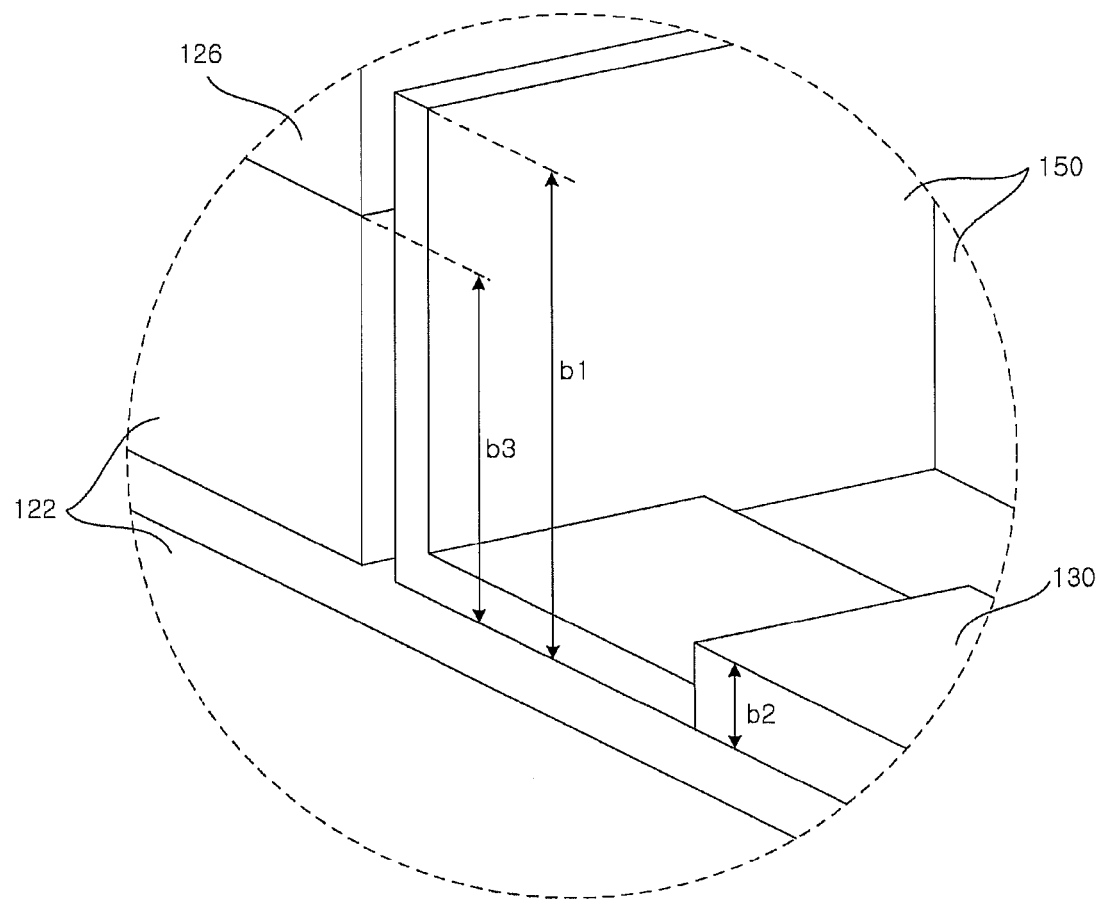

FIGS. 3 to 5 are enlarged views illustrating portion "P1" of FIG. 1 according to various exemplary embodiments.

In the embodiment illustrated in FIGS. 3 to 5, the same reference numbers as those shown in FIGS. 1 and 2 will be designated, and the configurations repeated with those illustrated in FIGS. 1 and 2 will be simply described or omitted.

Referring to FIG. 3, a functional member 150 may be disposed on the first region s1 of the first semiconductor layer 122 while being disposed between the first electrode 130 and one side surface of the light emitting structure 120 which includes the stepped side surface between the first and second regions s1 and s2.

In this case, the functional member 150 may be made of a conductive material. For example, the functional member 150 may contain at least one of silver (Ag), aluminum (Al), gold (Au), nickel (Ni), chromium (Cr), and copper (Cu).

The functional member 150 may have a height b1 greater than a height b2 of the first electrode 130 and less than a thickness (not shown) of the light emitting structure 120, with respect to a thickness direction of the light emitting structure 120.

Also, the functional member 150 may have a thickness of 0.08 μm to 1 μm. When the thickness of the functional member 150 is less than 0.08 μm, the growth and position of the functional member 150 may be difficult in a fabrication process. On the other hand, when the thickness of the functional member 150 is greater than 1 μm, production costs may be increased. That is, when the height b1 of the functional member 150 is less than the height b2 of the first electrode 130, light emitted from the active layer 126 is absorbed into the first electrode 130, and thus luminous efficiency may be deteriorated. On the other hand, when the height b1 of the functional member 150 is greater than the thickness of the light emitting structure 120, an orientation angle of light emitted to the upper surface of the second semiconductor layer 124 may be narrowed.

In this case, a spacing distance g1 between the functional member 150 and the first electrode 130 may be varied depending on the height b1 of the functional member 150, but the present disclosure is not limited thereto.

Although the functional member 150 shown in FIG. 3 is illustrated as being spaced apart from the light emitting structure 120 and the first electrode 130, a functional member 150 shown in FIG. 4 comes into contact with the stepped side surface between the first and second regions s1 and s2 of the light emitting structure 120, and a functional member 150 shown in FIG. 5 comes into contact with the first electrode 130.

First, referring to FIG. 4, the functional member 150 may be disposed to come into contact with the stepped side surface between the first and second regions s1 and s2.

In this case, the functional member 150 may be made of a conductive material as shown in FIG. 3. Thus, when the functional member 150 comes into contact with the active layer 126 and the second semiconductor layer 124, possibility of short circuit may be increased. Therefore, the functional member 150 may have a height b1 equal to or less than a thickness b3 of the stepped side surface between the first and second regions s1 and s2.

Here, when the height b1 of the functional member 150 is greater than the height b2 of the first electrode 130 and is 0.8 to 1 times the thickness b3 of the stepped side surface between the first and second regions s1 and s2, it may be possible to minimize that light emitted from the active layer 126 is directed toward the first electrode 130.

Referring to FIG. 5, a functional member 150 may be spaced apart from the stepped side surface between the first and second regions s1 and s2 and come into contact with one side surface of the first electrode 130.

That is, since the functional member 150 may be made of a conductive material as shown in FIG. 3 and come into contact with one side surface of the first electrode 130, current diffusion may be easily achieved.

Although the functional member 150 is illustrated as coming into contact with one side surface of the first electrode 130 in the illustrated embodiment, the first electrode 130 may be disposed to come into contact with an upper portion of the functional member 150. However, the present disclosure is not limited to the above-mentioned configuration.

Here, the functional member 150 may have a height b1 greater than the thickness b3 of the stepped side surface between the first and second regions s1 and s2, and a portion of a thickness of the functional member 150 may be equal to or less than the height b2 of the first electrode 130.

Although the functional member 150 is illustrated as being spaced apart from the stepped side surface between the first and second regions s1 and s2 in the illustrated embodiment, the functional member 150 may come into contact with the stepped side surface between the first and second regions s1 and s2, as shown in FIG. 4. However, the present disclosure is not limited to the above-mentioned configuration.

In addition, a roughness may be formed at one side surface of the functional member 150, namely, the side surface of the functional member 150 adjacent to one side surface of the light emitting structure 120. The roughness serves to generate irregular reflection so that light emitted from the active layer 126 is reflected at a reflective angle different from an incident angle thereof, thereby achieving an enhancement in luminous efficiency.

Figure 6:
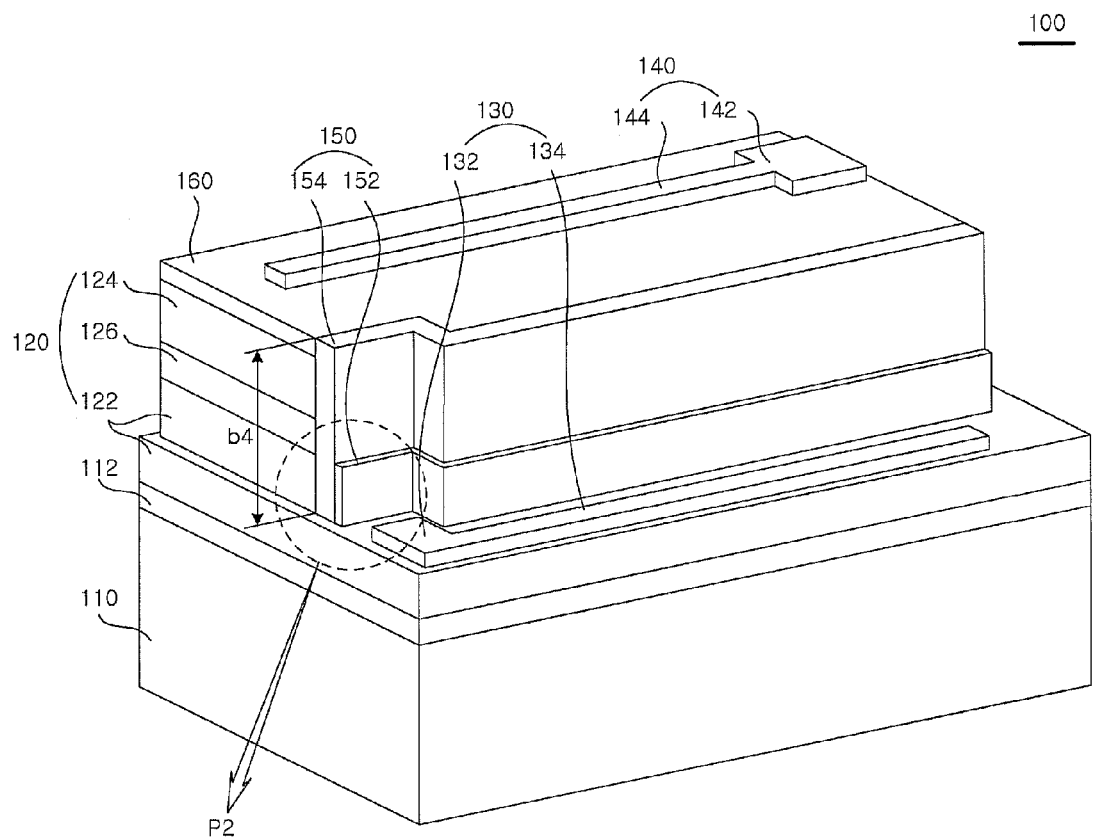
FIG. 6 is a perspective view illustrating a light emitting device according to a second embodiment.
Figure 7:
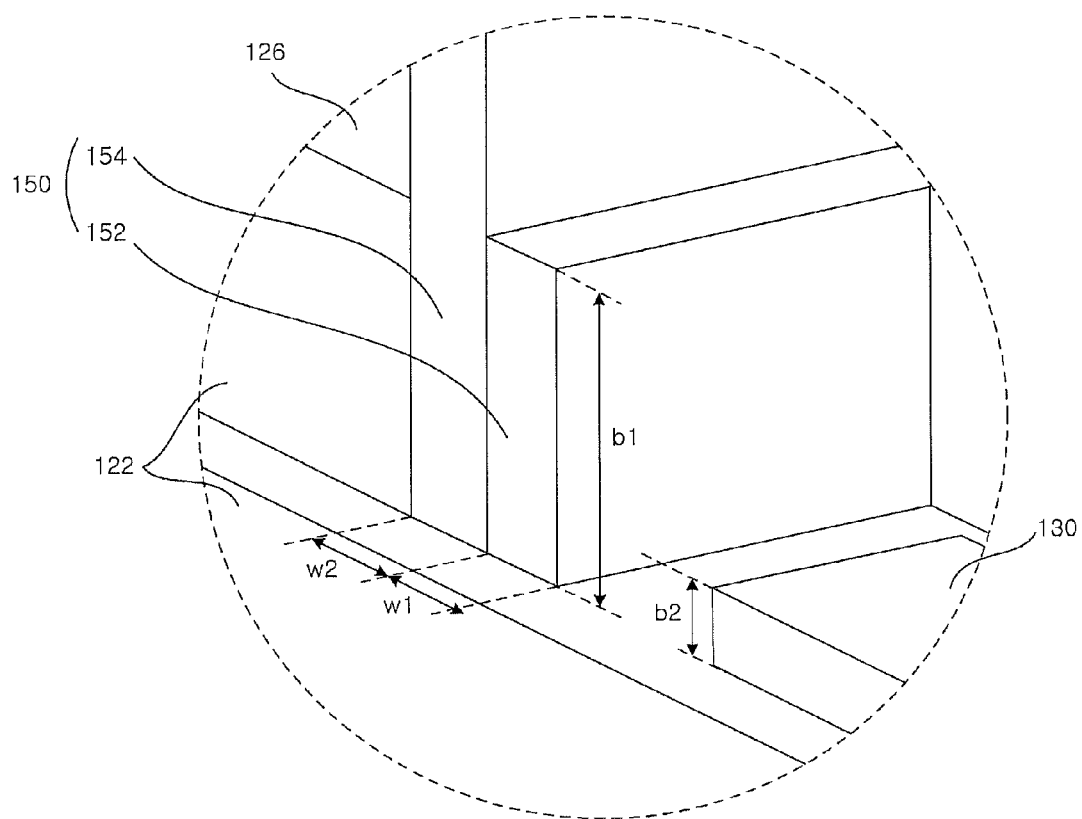
FIG. 7 is an enlarged view illustrating portion "P2" of FIG. 6 according to an exemplary embodiment.

FIG. 6 is a perspective view illustrating a light emitting device according to a second embodiment. FIG. 7 is an enlarged view illustrating portion "P2" of FIG. 6 according to an exemplary embodiment.

In the embodiment illustrated in FIGS. 6 and 7, the same reference numbers as those shown in FIG. 1 will be designated, and the configurations repeated with those illustrated in FIG. 1 will be simply described or omitted.

Referring to FIGS. 6 and 7, the light emitting device, which is designated by reference numeral 100, may include a support substrate 110 and a light emitting structure 120 disposed over the support substrate 110.

Also, the light emitting device 100 may include a functional member 150 adjacent to a stepped side surface between first and second regions s1 and s2, and a first electrode 130 adjacent to the functional member 150, and the functional member 150 and the first electrode 130 may be disposed on the first region s1.

The functional member 150 may include a first functional member 152 containing at least one conductive material, for example, silver (Ag), aluminum (Al), gold (Au), nickel (Ni), chromium (Cr), or copper (Cu), and a second functional member 154 disposed between the first functional member 152 and the stepped side surface between the first and second regions s1 and s2 while having insulation properties.

First, the second functional member 154 may be made of an insulation material. For example, the second functional member 154 may contain at least one of a silicon material, an epoxy material, and a ceramic material, but the present disclosure is not limited thereto.

In this case, the second functional member 154 may come into contact with at least one of one side surface of the first functional member 152 and one side surface of the light emitting structure 120 including the stepped side surface between the first and second regions s1 and s2. The second functional member 154 will be described as coming into contact with all the side surface of the light emitting structure 120 and the side surface of the first functional member 152 in the illustrated embodiment.

The second functional member 154 may have a height b4 equal to a thickness from the first region s1 to an upper surface of a second semiconductor layer 124 or greater than a height b1 of the first functional member 152.

That is, the second functional member 154 may prevent short circuit between a first semiconductor layer 122 and the second semiconductor layer 124 or between the first semiconductor layer 122 and an active layer 126 by the first functional member 152.

Here, the second functional member 154 may have a thickness w2 equivalent to 1 to 8 times a thickness w1 of the first functional member 152, and have a thickness w2 of 0.01 μm to 1 μm.

That is, when the thickness w2 of the second functional member 154 is less than 1 times the thickness w1 of the first functional member 152 or less than 0.01 μm, it may be difficult for the second functional member 154 to be disposed on the first region s1 and to provide an insulation function. On the other hand, when the thickness w2 of the second functional member 154 is greater than 8 times the thickness w1 of the first functional member 152 or greater than 1 μm, light loss may be generated in the course of transmitting light emitted from the active layer 126, and thus luminous efficiency may be deteriorated.

Since the first functional member 152 is similar to the functional member 150 illustrated in FIGS. 1 to 5, no description thereof will be given in detail.

Figure 8:
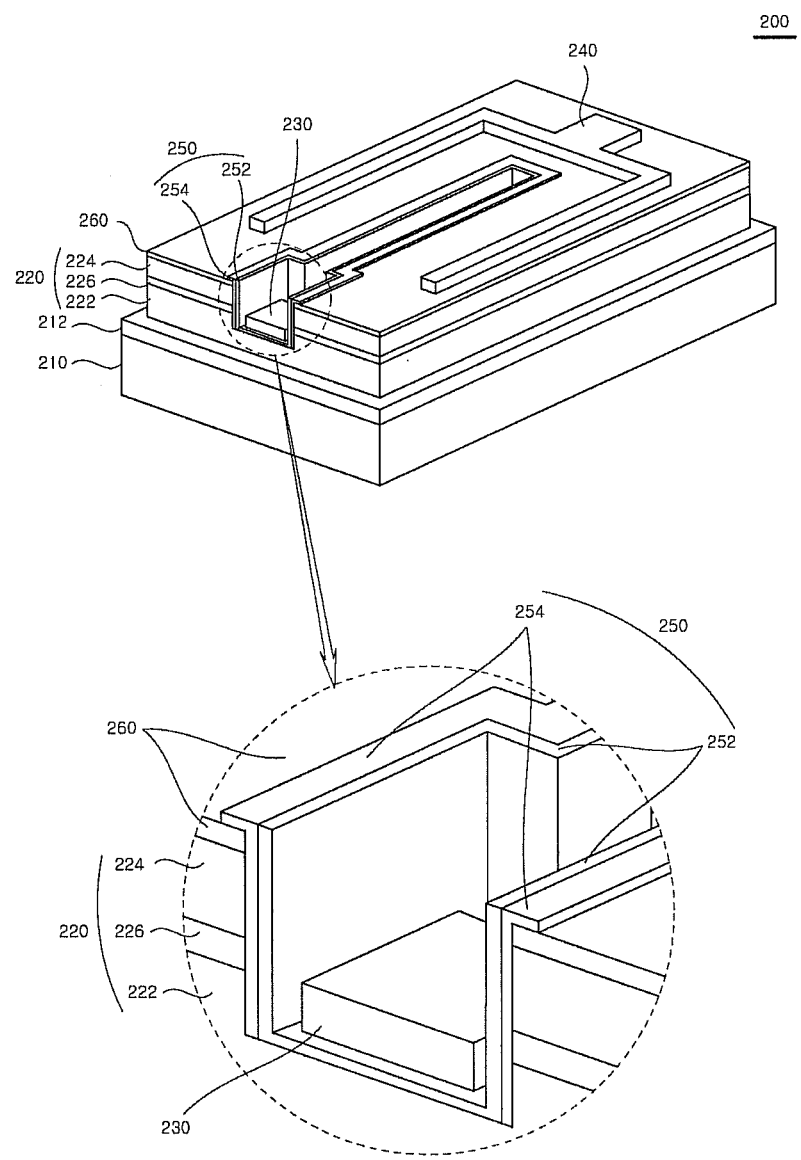
FIG. 8 is a perspective view illustrating a light emitting device according to a third embodiment.
Figure 9:
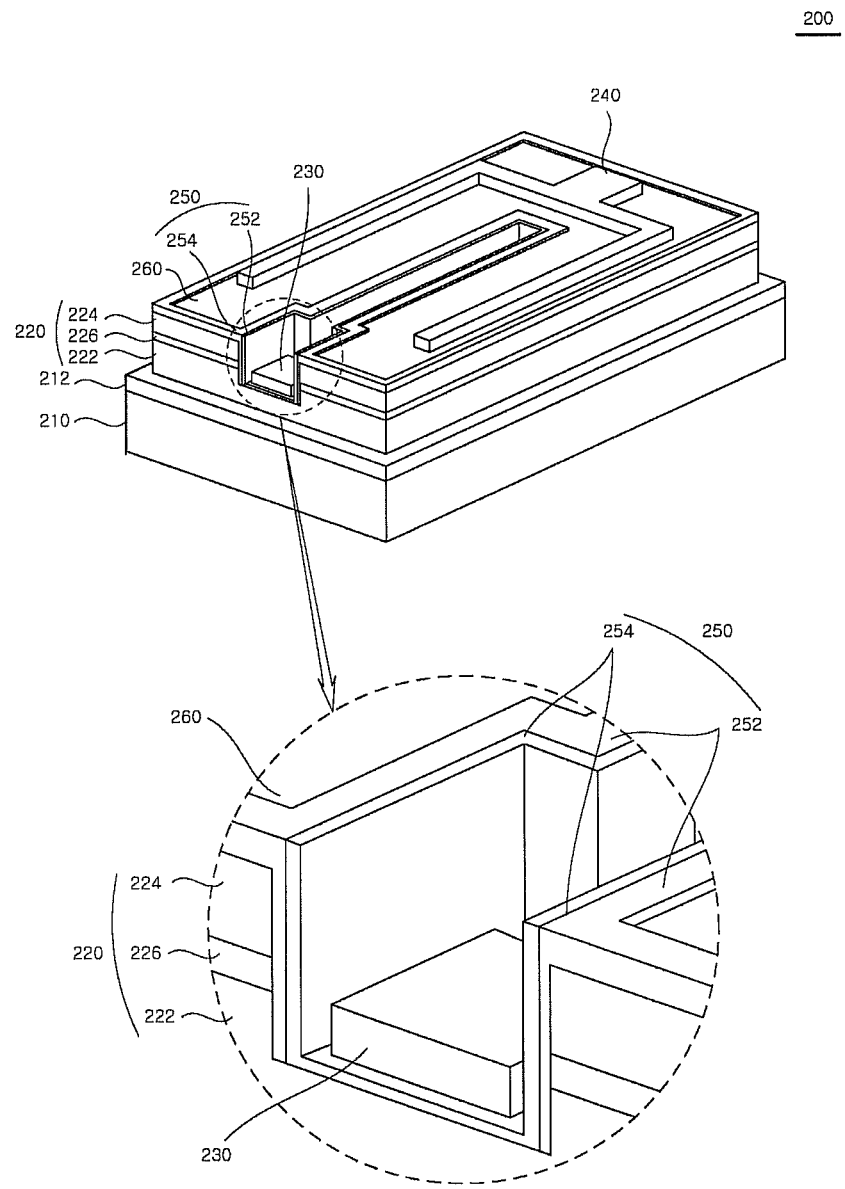
FIG. 9 is a perspective view illustrating a light emitting device according to a fourth embodiment.
Figure 10:
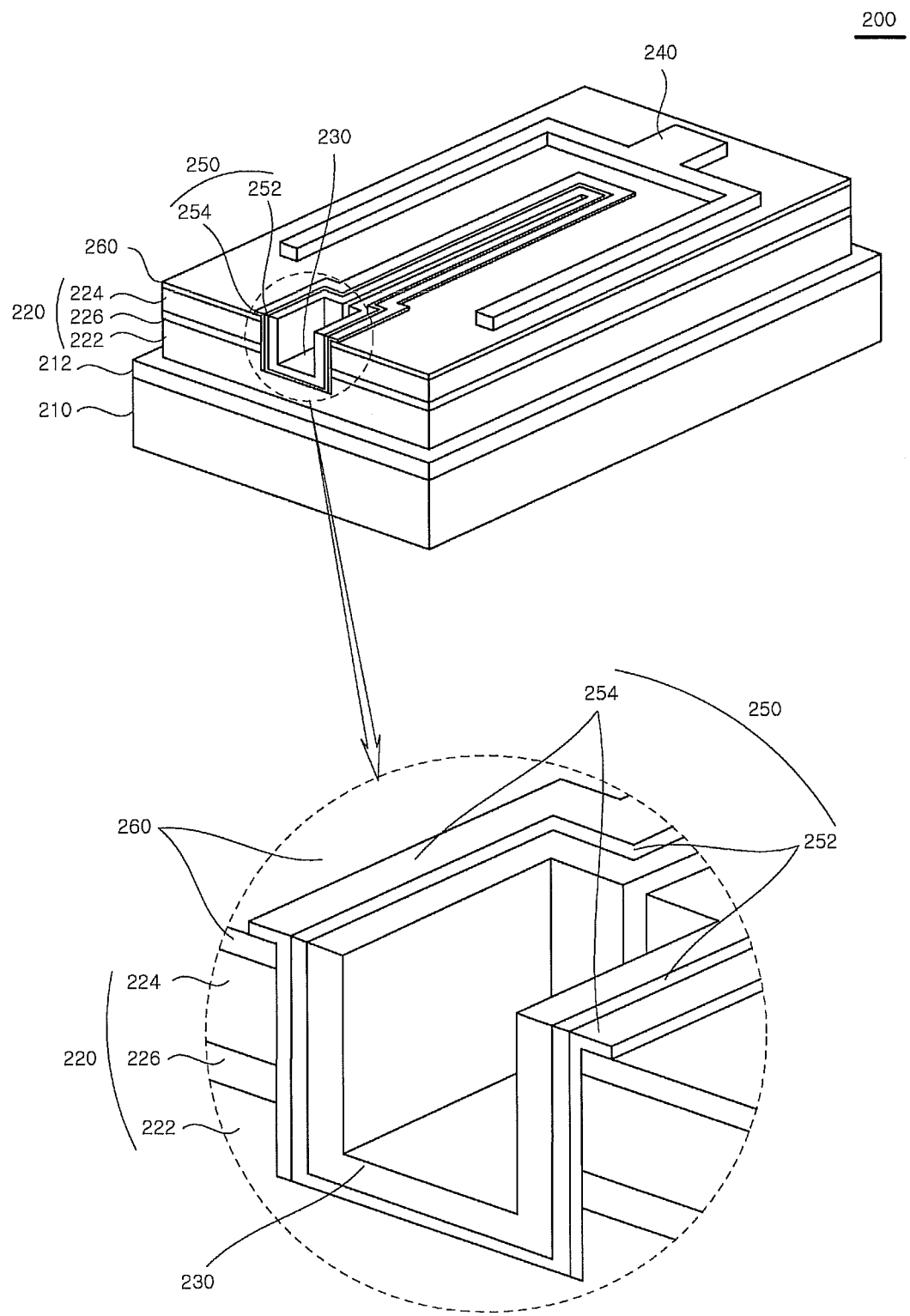
FIG. 10 is a perspective view illustrating a light emitting device according to a fifth embodiment.

FIG. 8 is a perspective view illustrating a light emitting device according to a third embodiment. FIG. 9 is a perspective view illustrating a light emitting device according to a fourth embodiment. FIG. 10 is a perspective view illustrating a light emitting device according to a fifth embodiment.

In the embodiment illustrated in FIGS. 8 to 10, the configurations repeated with those illustrated in FIGS. 1 to 7 will be simply described or omitted.

Referring to FIGS. 8 to 10, the light emitting device, which is designated by reference numeral 200, may include a support substrate 210 and a light emitting structure 220 disposed over the support substrate 210.

Since the support substrate 210 and the light emitting structure 220 are similar to those described in FIGS. 1 to 7, no description thereof will be given.

In this case, a light transmitting electrode layer 260 may be disposed on a second semiconductor layer 224 of the light emitting structure 220.

The light transmitting electrode layer 260 may be made of at least one of ITO, IZO (In—ZnO), GZO (Ga—ZnO), AZO (Al—ZnO), AGZO (Al—Ga ZnO), IGZO (In—Ga ZnO), $IrO_x$, $RuO_x$, $RuO_x$/ITO, $Ni/IrO_x/Au$, and $Ni/IrO_x/Au/ITO$. The light transmitting electrode layer 260 is formed at an upper surface of the second semiconductor layer 224, thereby enabling prevention of a current crowding phenomenon.

Here, the light transmitting electrode layer 260 may have a thickness of 10 nm to 300 nm, but the present disclosure is not limited thereto.

That is, a second electrode 240 may disposed on the light transmitting electrode layer 260, and the second electrode 240 may be electrically connected with the second semiconductor layer 224 through the light transmitting electrode layer 260.

The light emitting structure 220 may include a first semiconductor layer 222 including first and second regions (not shown), a second semiconductor layer 224, and an active layer 226, and the second semiconductor layer 224 and the active layer 226 are disposed over the first semiconductor layer 222 of the second region.

Here, a functional member 250 and a first electrode 230 may be disposed at the first region.

The functional member 250 may include a second functional member 254 disposed at a side surface of the light emitting structure 220 and a portion of an upper surface of the light transmitting electrode layer 260, a first functional member 252 disposed at the first semiconductor layer 222 of the first region and a side surface of the second functional member 254.

The second functional member 254 may be disposed to be laminated at a side surface of and a portion of the upper surface of the light transmitting electrode layer 260, but the present disclosure is not limited thereto.

That is, the second functional member 254 may be laminated at a portion of the upper surface of the light transmitting electrode layer 260 so as to previously prevent the first functional member 252 from coming into contact with the light transmitting electrode layer 260.

Since the functional member 250 illustrated in FIGS. 8 to 10 is similar to those described in FIGS. 1 to 7, no description thereof will be given.

The first electrode 230 may be disposed at an inner side of the first functional member 252, and be formed to have a single layer structure or a multilayer structure, but the present disclosure is not limited thereto.

Although the first electrode 230 is illustrated as having a square shape, the present disclosure is not limited thereto.

Alternatively, in the light emitting device 200 shown in FIG. 9, the light transmitting electrode layer 260 may be disposed so that an outer peripheral portion of the second semiconductor layer 224 is exposed. The second functional member 254 may be disposed at the exposed outer peripheral portion of the second semiconductor layer 224, but the present disclosure is not limited thereto.

Alternatively, in the light emitting device 200 shown in FIG. 10, the first electrode 230 may have a concave center portion similarly to the functional member 250, and come into contact with a side surface of the first functional member 252.

In this case, the first electrode 230 may be disposed at the functional member 250, and have a trench structure with the concave center portion as shown in FIG. 10 in a growth process. Although not shown in FIG. 10, the first electrode 230 may be formed to have a flat center portion, but the present disclosure is not limited thereto.

Although not shown in FIGS. 1 to 10, each of the light emitting devices 100 and 200 may include a current blocking layer (CBL) (not shown). The current blocking layer may be disposed between the second semiconductor layer 124 or 224 and the light transmitting electrode layer 160 or 260, between the light transmitting electrode layer 160 or 260 and the second electrode 140 or 240, or within the light transmitting electrode layer 160 or 260 while being overlapped with the second electrode 140 or 240.

In this case, the current blocking layer may have a thickness of 10 nm to 500 nm, but the present disclosure is not limited thereto.

Figure 11:
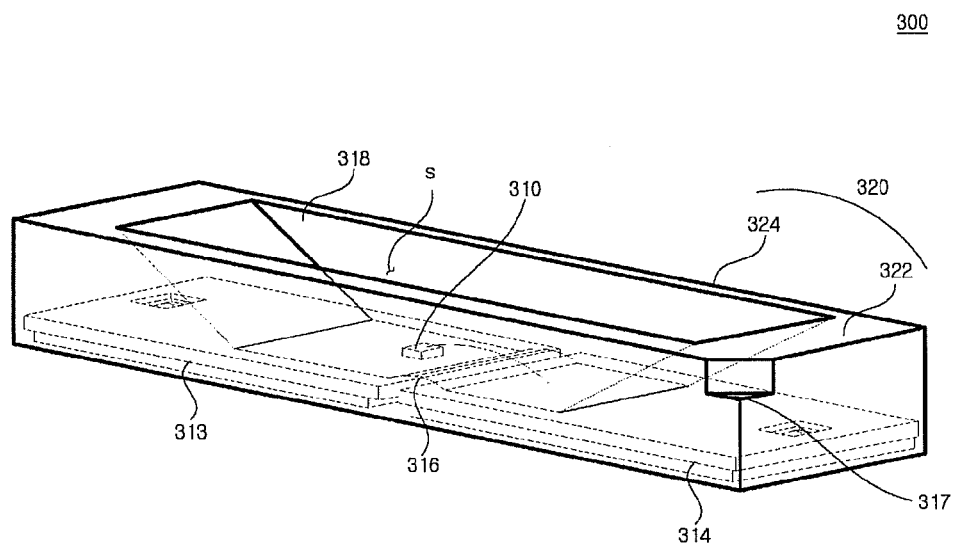
FIG. 11 is a perspective view illustrating a light emitting device package including a light emitting device according to an exemplary embodiment.

FIG. 11 is a perspective view illustrating a light emitting device package including a light emitting device according to an exemplary embodiment.

FIG. 11 is a perspective view illustrating a shape of seeing though a portion of light emitting device package which is designated by reference numeral 300. Although the light emitting device package 300 is illustrated as being of a top-view type in the illustrated embodiment, the light emitting device package 300 may be of a side-view type. However, the light emitting device package 300 is not limited to the above-mentioned types.

Referring to FIG. 11, the light emitting device package 300 may include a light emitting device 310 and a body 320 in which the light emitting device 310 is disposed.

The body 320 may include a first partition wall 322 arranged in a first direction (not shown) and a second partition wall 324 arranged in a second direction (not shown) intersecting with the first direction. The first and second partition walls 322 and 324 may be integrally formed and be formed by an injection molding process, an etching process, or the like, but the present disclosure is not limited thereto.

The first and second partition walls 322 and 324 may be made of at least one of a resin material such as polyphthalamide (PPA), silicon (Si), aluminum (Al), aluminum nitride (AlN), $AlO_x$, liquid crystal polymer such as photo sensitive glass (PSG), polyamide 9T (PA9T), syndiotactic polystyrene (SPS), a metal material, sapphire ($Al_2O_3$), beryllium oxide (BeO), and a ceramic material, or may be a Printed Circuit Board (PCB).

An upper surface shape of the body 320 forming the first and second partition walls 322 and 324 may have various shapes, such as triangular, square, polygonal, and circular shapes, according to purposes and designs of the light emitting device 310, but the present disclosure is not limited thereto.

The first and second partition walls 322 and 324 may form a cavity s in which the light emitting device 310 is disposed. The cavity s may have a cup shape, a concave container shaper, and the like in section. The first and second partition walls 322 and 324 defining the cavity s may be formed to be inclined downward.

A plane shape of the cavity s may have various shapes, such as triangular, square, polygonal, and circular shapes, but the present disclosure is not limited thereto.

Meanwhile, first and second lead frames 313 and 314 may be disposed at a lower surface of the body 320. The first and second lead frames 313 and 314 may contain one or more metal materials selected from titanium (Ti), copper (Cu), nickel (Ni), gold (Au), chrome (Cr), tantalum (Ta), platinum (Pt), tin (Sn), silver (Ag), phosphor (P), aluminum (Al), indium (In), palladium (Pd), cobalt (Co), silicon (Si), germanium (Ge), hafnium (Hf), ruthenium (Ru), and iron (Fe), or alloys thereof.

The first and second lead frames 313 and 314 may have a single layer structure or a multilayer structure, but the present disclosure is not limited thereto.

Each inner surface of the first and second partition walls 322 and 324 may be slantly formed to have a predetermined inclined angle on the basis of any one of the first and second lead frames 313 and 314. Accordingly, the reflective angle of light emitted from the light emitting device 310 may be varied according to the inclined angle, and thus an orientation angle of outwardly emitted light may be adjusted. As the orientation angle of light decreases, the convergence of light outwardly emitted from the light emitting device 310 increases. On the other hand, as the orientation angle of light increases, the convergence of light outwardly emitted from the light emitting device 310 decreases.

The body 320 may have a plurality of inclined angles at an inner surface thereof, but the present disclosure is not limited thereto.

The first and second lead frames 313 and 314 may be electrically connected to the light emitting device 310, and may supply power to the light emitting device 310 by being respectively connected to a positive (+) pole and a negative (−) pole of an external power supply unit (not shown).

The light emitting device 310 will be described as being disposed on the first lead frame 313 and the second lead frame 314 will be described as being spaced apart from the first lead frame 313 in the illustrated embodiment. The light emitting device 310 may be mounted on the first lead frame 313 by a die bonding method, and may also be wire-bonded to the second lead frame 314 via a wire (not shown), and thus power may be supplied from the first and second lead frames 313 and 314.

Here, the light emitting device 310 may be bonded to the first and second lead frames 313 and 314 while having different polarities.

The light emitting device 310 may be wire-bonded or die-bonded to each of the first and second lead frames 313 and 314, but the present disclosure is not limited thereto.

Although the light emitting device 310 is described as being disposed at the first lead frame 313 in the illustrated embodiment, but the present disclosure is not limited thereto.

The light emitting device 310 may be bonded on the first lead frame 313 by a bonding member (not shown).

Here, an insulation dam 316 may be formed between the first and second lead frames 313 and 314, to prevent electrical short circuit between the first and second lead frames 313 and 314.

The insulation dam 316 may be formed, an upper portion thereof, in a semicircular shape in the illustrated embodiment, but the present disclosure is not limited thereto.

The body 320 may be formed with a cathode mark 317.

The light emitting device 310 may be a light emitting diode. The light emitting diode, for example, may be a colored light emitting diode to emit red, green, blue and white light or the like, or an ultraviolet (UV) light emitting diode to emit ultraviolet light, but the present disclosure is not limited thereto. Alternatively, a plurality of light emitting devices 310 may be mounted on the first lead frame 313, or at least one light emitting device 310 may be mounted on each of the first and second lead frames 313 and 314. There is no limit as to the number and mounted position of the light emitting device 310.

The body 320 may include a resin encapsulant 318 to fill the cavity s. That is, the resin encapsulant 318 may have a dual molded structure or a triple molded structure, but the present disclosure is not limited thereto.

The resin encapsulant 318 may take the form of a film, and may contain at least one of a fluorescent substance and a light diffusion agent. Alternatively, the resin encapsulant 318 may be made of a transparent material not containing the fluorescent substance and the light diffusion agent, but the present disclosure is not limited thereto.

Figure 12:
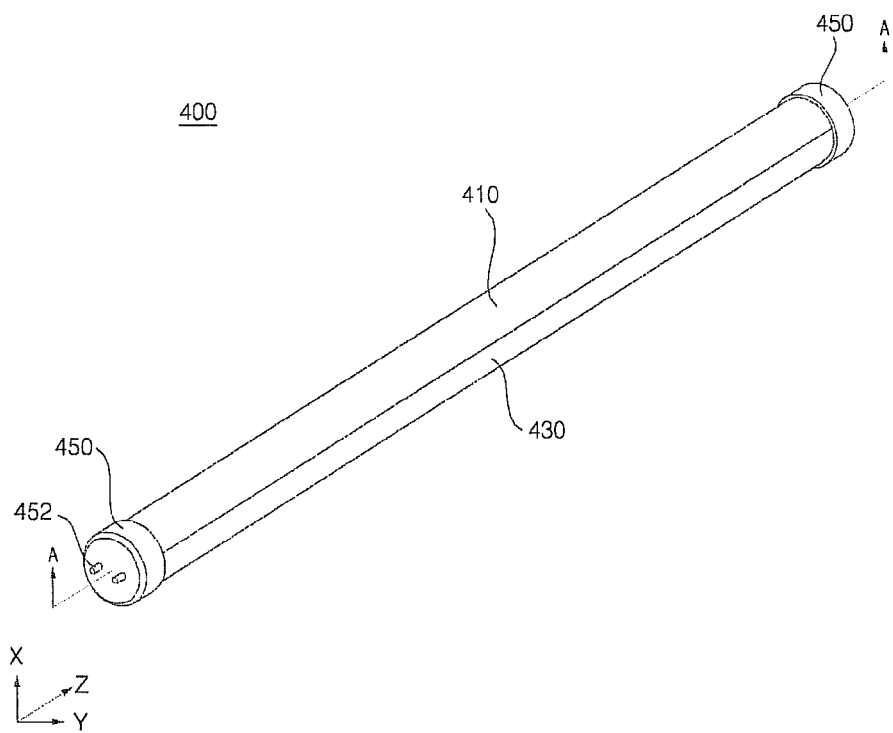
FIG. 12 is a perspective view illustrating a lighting apparatus including a light emitting device according to an exemplary embodiment.
Figure 13:
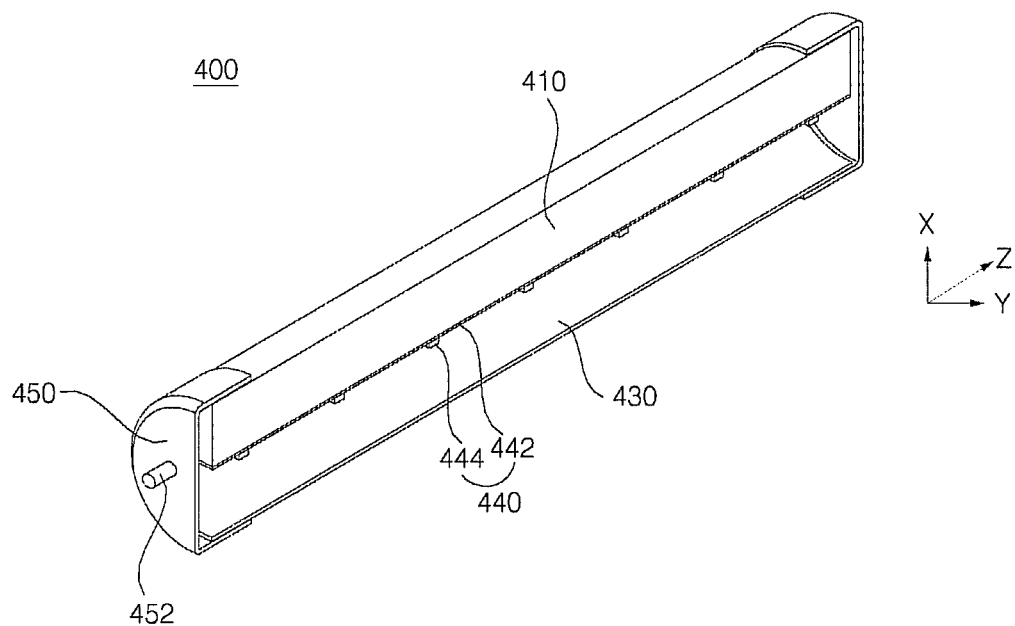
FIG. 13 is a sectional view taken along line A-A of the lighting apparatus shown in FIG. 12.

FIG. 12 is a perspective view illustrating a lighting apparatus including a light emitting device according to an exemplary embodiment. FIG. 13 is a sectional view taken along line A-A of the lighting apparatus shown in FIG. 12.

In the following description, for explaining the shape of the lighting apparatus, which is designated by reference numeral 400, according to the illustrated embodiment in more detail, a longitudinal direction of the lighting apparatus 400 is referred to as a "longitudinal direction Z", a horizontal direction perpendicular to the longitudinal direction Z is referred to as a "horizontal direction Y", and a height direction perpendicular to both the longitudinal direction Z and the horizontal direction Y is referred to as a "height direction X".

That is, FIG. 13 is a sectional view taken along a Z-X plane of the lighting apparatus 400 shown in FIG. 12, and viewed in the horizontal direction Y.

Referring to FIGS. 12 and 13, the lighting apparatus 400 may include a body 410, a cover 430 coupled to the body 410, and end caps 450 located at opposite ends of the body 410.

A light emitting device module 440 is coupled to a lower surface of the body 410. The body 410 may be made of a metal material having superior conductivity and superior heat radiation effects so as to outwardly dissipate heat generated from the light emitting device module 440 through an upper surface of the body 410.

In light emitting device packages 444, a roughness (not shown) may be formed at each lead frame (not shown), thereby enhancing bonding reliability and luminous efficiency. Thus, it may be possible to design a slim and compact display apparatus.

The light emitting device packages 444 may be mounted in multiple rows while having various colors, to form a multi-color array. The light emitting device packages 644 may be mounted at the same distance, or may be mounted at different distances to enable brightness adjustment, if necessary. A PCB 442 may be a metal core PCB (MCPCB), a flame retardant-4 (FR4) PCB, or the like.

The cover 430 may have a circular shape to enclose a lower surface of the body 410, but the present disclosure is not limited thereto.

The cover 430 serves to protect the light emitting device module 440 from external foreign matter, etc. The cover 430 may contain light diffusion particles to achieve anti-glare effects and uniform emission of light generated from the light emitting device packages 444. At least one of inner and outer surfaces of the cover 430 may be provided with a prism pattern. Also, a fluorescent substance may be applied to at least one of the inner and outer surfaces of the cover 430.

Since the light generated from the light emitting device packages 444 is outwardly emitted through the cover 430, the cover 430 should have high light transmittance and heat resistance sufficient to endure heat generated from the light emitting device packages 444. To this end, the cover 430 may be made of polyethylene terephthalate (PET), polycarbonate (PC), polymethyl methacrylate (PMMA), or the like.

The end caps 450 may be disposed at the opposite ends of the body 410, and function to seal a power supply unit (not shown). Each end cap 450 is formed with power pins 452, so that the lighting apparatus 400 according to the illustrated embodiment may be directly connected to a terminal, from which an existing fluorescent lamp has been removed, without an additional connector.

Figure 14:
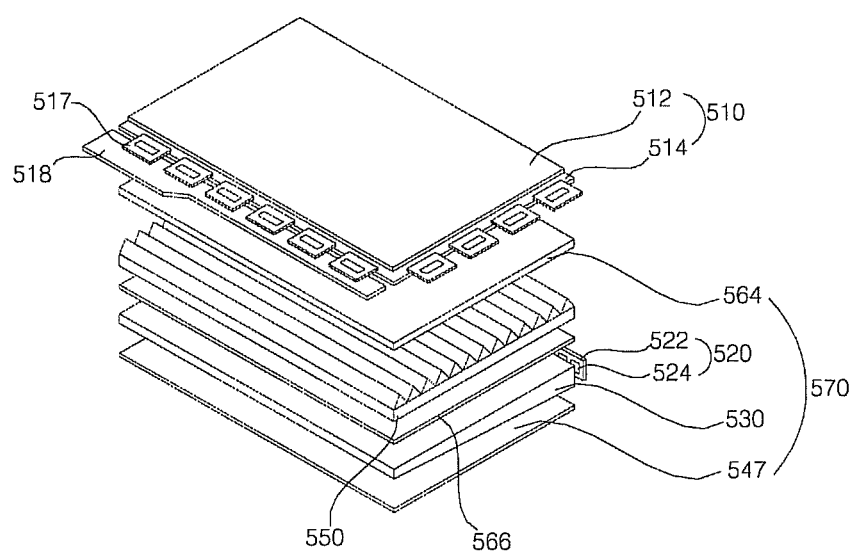
FIG. 14 is an exploded perspective view illustrating a liquid crystal display apparatus including a light emitting device according to a first exemplary embodiment.

FIG. 14 is an exploded perspective view illustrating a liquid crystal display apparatus including a light emitting device according to a first exemplary embodiment.

FIG. 14 illustrates an edge-light type liquid crystal display apparatus. The liquid crystal display apparatus, which is designated by reference numeral 500, may include a liquid crystal display panel 510 and a backlight unit 570 for supply of light to the liquid crystal display panel 510.

The liquid crystal display panel 510 may display an image using the light supplied from the backlight unit 570. The liquid crystal display panel 510 may include a color filter substrate 512 and a thin film transistor substrate 514, which face each other with liquid crystals interposed therebetween.

The color filter substrate 512 may realize the color of an image displayed through the liquid crystal display panel 510.

The thin film transistor substrate 514 is electrically connected to a printed circuit board (PCB) 518, on which a plurality of circuit elements is mounted, by means of a drive film 517. The thin film transistor substrate 514 may apply drive voltage provided by the PCB 518 to liquid crystals in response to a drive signal transmitted from the PCB 518.

The thin film transistor substrate 514 may include pixel electrodes and thin film transistors in the form of thin films formed on another substrate made of a transparent material such as glass or plastic.

The backlight unit 570 includes a light emitting device module 520 to emit light, a light guide plate 530 to change light emitted from the light emitting device module 520 into planar light and to provide the planar light to the liquid crystal display panel 510, a plurality of films 550, 566 and 564 to enhance uniformity in luminance distribution and vertical light incidence of light emerging from the light guide plate 530, and a reflective sheet 547 to reflect light emitted rearwards from the light guide plate 530 toward the light guide plate 530.

The light emitting device module 520 may include a plurality of light emitting device packages 524 and a PCB 522 on which the plural light emitting device packages 524 are mounted to form an array.

The backlight unit 570 may include a diffusion film 566 to diffuse light incident thereupon from the light guide plate 530 toward the liquid crystal display panel 510, and a prism film 550 to converge the diffused light so as to enhance vertical light incidence. The backlight unit 570 may further include a protective film 564 to protect the prism film 550.

Figure 15:
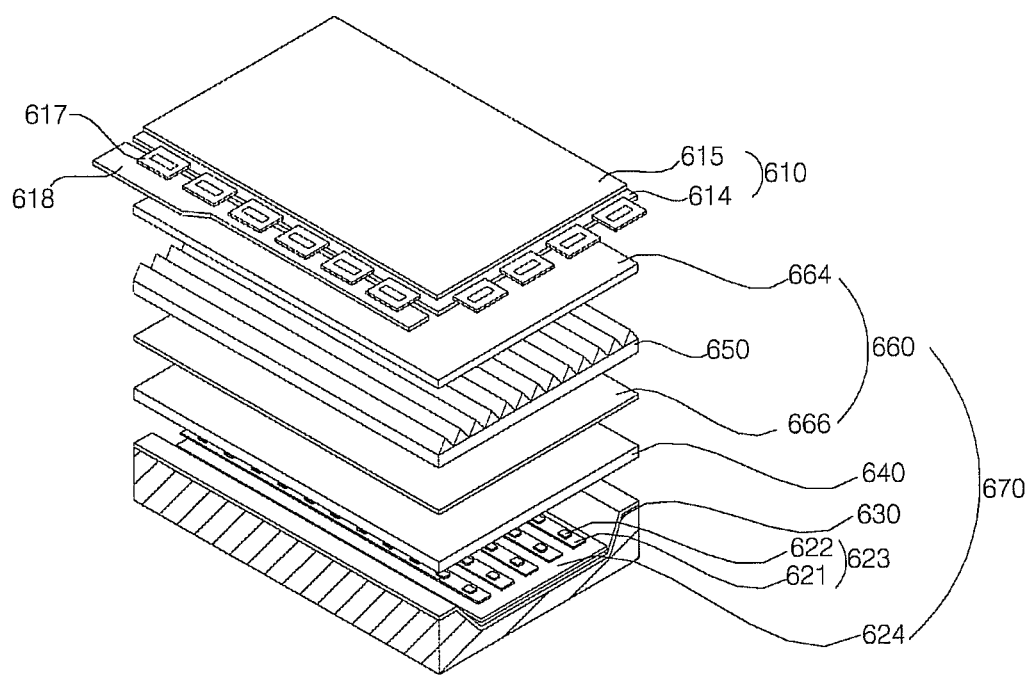
FIG. 15 is an exploded perspective view illustrating a liquid crystal display apparatus including a light emitting device according to a second exemplary embodiment.

FIG. 15 is an exploded perspective view illustrating a liquid crystal display apparatus including a light emitting device according to a second exemplary embodiment.

In the embodiment illustrated in FIG. 15, the same configuration as that illustrated in FIG. 14 will not be repeatedly described in detail.

FIG. 25 illustrates a direct type liquid crystal display apparatus. The liquid crystal display apparatus, which is designated by reference numeral 600, may include a liquid crystal display panel 610 and a backlight unit 670 for supply of light to the liquid crystal display panel 610.

Since the liquid crystal display panel 610 is similar to that of FIG. 14, no detailed description will be given thereof.

The backlight unit 670 may include a plurality of light emitting device modules 623, a reflective sheet 624, a lower chassis 630 in which the light emitting device modules 623 and reflective sheet 624 are accommodated, a diffusion plate 640 disposed over the light emitting device modules 623, and a plurality of optical films 660.

Each light emitting device module 623 may include a plurality of light emitting device packages 622, and a PCB 621 on which the plural light emitting device packages 622 are mounted to form an array.

The reflective sheet 624 reflects light generated by the light emitting device packages 622 toward the liquid crystal display panel 610, thereby achieving an enhancement in light utilization efficiency.

Meanwhile, the light generated from the light emitting device modules 623 is incident upon the diffusion plate 640. The optical films 660 are disposed over the diffusion plate 640. The optical films 660 may be comprised of a diffusion film 666, a prism film 650 and a protective film 664.

Here, the lighting apparatus 400, and the liquid crystal display apparatuses 500 and 600 may be included in a lighting system. In addition, an apparatus or the like, which includes a light emitting device package and is used for illumination, may be included in the lighting system.

As is apparent from the above description, in accordance with a light emitting device, a light emitting structure is formed on a second region of a first semiconductor layer, and a functional member and a first electrode is formed on a first region of the first semiconductor layer. Thus, it may be possible to prevent short circuit between the first electrode and the light emitting structure by the functional member, to prevent light emitted from an active layer from being absorbed into the first electrode, and to reduce forward voltage (VF) of the light emitting device by restricting a width of the first region. Consequently, an area of the active layer may be increased, thereby achieving an enhancement in luminous efficiency.

Particular features, structures, or characteristics described in connection with the embodiment are included in at least one embodiment of the present disclosure and not necessarily in all embodiments. Furthermore, the particular features, structures, or characteristics of any specific embodiment of the present disclosure may be combined in any suitable manner with one or more other embodiments or may be changed by those skilled in the art to which the embodiments pertain. Therefore, it is to be understood that contents associated with such combination or change fall within the spirit and scope of the present disclosure.

Although embodiments have been described with reference to a number of illustrative embodiments thereof, it should be understood that numerous other modifications and applications may be devised by those skilled in the art that will fall within the intrinsic aspects of the embodiments. More particularly, various variations and modifications are possible in concrete constituent elements of the embodiments. In addition, it is to be understood that differences relevant to the variations and modifications fall within the spirit and scope of the present disclosure defined in the appended claims.

What is claimed is:

1. A light emitting device comprising:
a light emitting structure comprising a first semiconductor layer doped with a first dopant while comprising a first region and a second region disposed over the first region and having a first portion stepped relative to the first region, a second semiconductor layer doped with a second dopant different from the first dopant while disposed over the second region, and an active layer disposed between the first and second semiconductor layers;
a first electrode disposed directly on the first region of the first semiconductor layer;
a second electrode disposed on an upper surface of the second semiconductor layer;
a light transmitting electrode layer disposed between the second semiconductor layer and the second electrode, and a portion of an upper surface of the light transmitting electrode layer is exposed; and
a first conductive functional member including a conductive material and disposed on an upper surface of the first region and between one side surface of the light emitting structure and the first electrode, wherein the first functional member has a height greater than a thickness of the first electrode and less than a thickness of the light emitting structure, with respect to a thickness direction of the light emitting structure, and
wherein the first functional member is disposed in parallel with a side wall surface of a second stepped portion of the second region, the second region includes the second stepped portion relative to the first region and a portion of the first semiconductor layer being below the stepped portion, wherein the first functional member reflects or refracts light emitted from the active layer to prevent the light from being directed toward the first electrode, the first functional member being spaced apart from and does not contact any portion of the first electrode and the second electrode; and
a separate second functional member fabricated from an insulative material and being non-conductive, the second functional member being disposed on an upper surface of the first region and between the first functional member and one side surface of the light emitting structure, a face of the second functional member contacts a face of the first functional member, an upper surface of the second functional member is aligned with the upper surface of the light transmitting electrode layer, the second functional member has a height equal to a thickness measured from an upper surface of the first region to at least the upper surface of the second semiconductor layer, the second functional member height above the upper surface of the first region is greater than a height of the first functional member measured from the upper surface of the first region such that the second functional member prevents the first functional member from contacting the second semiconductor layer, and the second functional member being spaced apart from and does not contact and portion of the first electrode and the second electrode, and the second functional member is in direct contact a side wall surface of the second stepped portion of the second region.

2. The light emitting device according to claim 1, wherein the first functional member comprising at least one of aluminum (Al) silver (Ag), nickel (Ni), chromium (Cr), or copper (Cu).

3. The light emitting device according to claim 2, wherein the first functional member is formed with a roughness at a side surface adjacent to one side surface of the light emitting structure.

4. The light emitting device according to claim 2, wherein the first functional member has a thickness of 0.08 µm to 1 µm.

5. The light emitting device according to claim 2, wherein:
the second functional member contains at least one of an epoxy material and a ceramic material.

6. The light emitting device according to claim 5, wherein the second functional member has a thickness of 0.01 µm to 1 µm.

7. The light emitting device according to claim 5, wherein the second functional member has a thickness equivalent to 1 to 8 times a height of the first functional member.

8. The light emitting device according to claim 1, wherein:
the active layer comprises at least one well layer and barrier layer having different energy band gaps; and
the well layer or barrier layer adjacent to the second semiconductor layer has a greater energy band gap than the well layer or barrier layer adjacent to the first semiconductor layer.

9. The light emitting device according to claim 1, wherein:
at least one of the first and second electrodes comprises at least one layer; and
the at least one layer comprises one layer adjacent to the first semiconductor layer, which comprises at least one of Al, Ag, Au, Ni, Cr, and Cu.

10. The light emitting device according to claim 1, wherein the second electrode is partially inserted into the second semiconductor layer.

11. The light emitting device according to claim 1, wherein the light transmitting electrode layer comprises at least one of ITO, IZO (In—ZnO), GZO (Ga—ZnO), AZO (Al—ZnO), AGZO (Al—Ga ZnO), IGZO (In—Ga ZnO),IrO$_x$, RuO$_x$, RuO$_x$/ITO, Ni/IrO$_x$/Au, and Ni/IrO$_x$/Au/ITO.

12. The light emitting device according to claim 1, wherein the light transmitting electrode layer has a thickness of 10 nm to 300 nm.

13. The light emitting device according to claim 1, further comprising:
a current blocking layer (CBL) disposed between the second semiconductor layer and the light transmitting electrode layer, between the light transmitting electrode layer and the second electrode, or within the light transmitting electrode layer while being overlapped with the second electrode.

14. The light emitting device according to claim 13, wherein the current blocking layer has a thickness of 10 nm to 500 nm.

15. The light emitting device according to claim 1, wherein the first region has a width of 5 µm to 15 µm.

16. A backlight unit comprising:
a light emitting device package comprising a light emitting device, which comprises a light emitting structure, a first electrode, a second electrode, a light transmitting electrode layer, and a first conductive and a separate second functional members, and a body comprises a first and second lead frames electrically connected to the first and second electrodes of the light emitting device, the light emitting structure comprising a first semiconductor layer doped with a first dopant while comprising a first region and a second region disposed over the first region and stepped relative to the first region, a second semiconductor layer doped with a second dopant different from the first dopant while disposed over the second region, and an active layer disposed between the first and second semiconductor layers, the first electrode being directly disposed on the first region of the first semiconductor layer, the second electrode being disposed on an upper surface of the second semiconductor layer, the light transmitting electrode layer being disposed between the second semiconductor layer and the second electrode, a portion of an upper surface of the light transmitting electrode layer is exposed, the second functional member being disposed between one side surface of the light emitting structure and the first electrode; and
a light guide plate to change light emitted from the light emitting device package into planar light, wherein the light emitting device has a structure in which the first functional member has a thickness greater than a thickness of the first electrode and less than a thickness of the light emitting structure, with respect to a thickness direction of the light emitting structure, and
wherein the first functional member is disposed in parallel with a side wall surface of a second stepped portion of the second region, the second region includes the second stepped portion relative to the first region and a portion of the first semiconductor layer below the stepped portion, wherein the first functional member reflects or refracts light emitted from the active layer, thereby preventing the light from being directed toward the first electrode, and
wherein the first functional member includes conductive material, the first functional member being disposed on the upper surface of the first region, the second functional member is made of an insulation material and is not conductive, the second functional member is disposed on an upper surface of the first region and between the first functional member and a side surface of the light emitting structure, the second functional member contacts a face of the first functional member, an upper surface of the second functional member is aligned with the upper surface of the light transmitting electrode layer, and the second functional member has a height equal to a thickness measured from an upper surface of the first region to the upper surface of the second semiconductor layer, the second functional member height above the upper surface of the first region is greater than a height of the first functional member measured from the upper surface of the first region such that the second functional member prevents the first functional member from contacting the second semiconductor layer, and the second functional member being spaced apart from and does not contact any portion of the first electrode and the second electrode, and the first functional member being spaced apart from and does not contact any portion of the first electrode and the second electrode, and the second functional member is in direct contact a side wall surface of the second stepped portion of the second region.

17. The light emitting device according to claim 1, wherein the first electrode includes a first pad electrode and a first finger electrode, wherein the second electrode includes a second pad electrode and a second finger electrode, wherein the second finger electrode extends in a direction of the first pad electrode.

18. The light emitting device according to claim 1, wherein the light transmitting electrode layer includes a pattern, wherein the pattern is any one of a dot pattern, an irregularity pattern, and a lattice pattern.

* * * * *